(12) United States Patent
Davis

(10) Patent No.: US 7,262,360 B1
(45) Date of Patent: Aug. 28, 2007

(54) UNDERWATER POWER GENERATION USING UNDERWATER THERMOCLINE

(75) Inventor: Philip Davis, Panama City Beach, FL (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 807 days.

(21) Appl. No.: 10/644,575

(22) Filed: Aug. 18, 2003

(51) Int. Cl.
*H01L 35/30* (2006.01)

(52) U.S. Cl. ............... 136/205; 136/201; 136/240

(58) Field of Classification Search ........... 136/205, 136/200–242, 201, 240
See application file for complete search history.

(56) References Cited

U.S. PATENT DOCUMENTS

| | | | |
|---|---|---|---|
| 4,448,028 A * | 5/1984 | Chao et al. ............ 62/3.3 |
| 5,430,322 A * | 7/1995 | Koyanagi et al. ........ 257/467 |
| 6,914,343 B2 * | 7/2005 | Hiller et al. ............ 290/43 |
| 2003/0112603 A1 * | 6/2003 | Roesner et al. .......... 361/719 |
| 2004/0156684 A1 * | 8/2004 | Pionetti ................ 405/224.2 |

* cited by examiner

*Primary Examiner*—Nam Nguyen
*Assistant Examiner*—Anthony Fick
(74) *Attorney, Agent, or Firm*—James T. Shepherd

(57) ABSTRACT

Underwater power generation for an underwater vessel is provided when the vessel transits through an underwater thermocline. At least a portion of the shell of the vessel is made from a thermally conductive material. Thermo-to-electric energy converters are electrically coupled together with each converter having a first surface thermally coupled to the shell's inner surface. A phase change material is thermally coupled to each opposing second surface of the converters. The phase change material has a phase change temperature that is between the upper and lower temperature extremes of the underwater thermocline's temperature range. The converters generate electrical power as the underwater vessel transits through the underwater thermocline.

16 Claims, 1 Drawing Sheet

UNDERWATER POWER GENERATION USING UNDERWATER THERMOCLINE

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to underwater power generation, and more particularly to a method and system for underwater power generation in which power is generated as an underwater vessel transits an underwater thermocline.

BACKGROUND OF THE INVENTION

Power for some military and civilian underwater vehicles is currently supplied by onboard batteries which have a fixed amount of energy available. Therefore, the duration of an underwater mission powered by batteries is limited by the storage capability of the batteries and the rate of power consumption during the mission.

SUMMARY OF THE INVENTION

Accordingly, it is an object of the present invention to provide a method and system of underwater power generation for supplying power to an underwater vessel.

Another object of the present invention is to provide a method and system of underwater power generation utilizing an underwater thermocline.

Other objects and advantages of the present invention will become more obvious hereinafter in the specification and drawings.

In accordance with the present invention, power generation is provided for an underwater vessel that transits through an underwater thermocline. At least a portion of a shell of an underwater vessel is made from a thermally conductive material. The portion of the shell has an outer surface in contact with a surrounding underwater environment and a dry inner surface opposing the outer surface. One or more thermo-to-electric energy converters are placed in contact with the inner surface of the shell. Hence, whenever heat energy flows into or out of the vessel through the energy converter, electrical power will be generated. For example, a plurality of thermoelectric elements could be electrically coupled together to serve as the energy converters. Each thermoelectric element would have a first surface and a second surface, where the first surface is thermally coupled to the inner surface of the shell. In order to increase efficiency of the power generation, a phase change material can be thermally coupled to each second surface of the thermoelectric elements. The phase change material should have a phase change temperature that is between the upper and lower temperature extremes encountered by the vessel as it transits the underwater thermocline. The energy converters generate electrical power as the underwater vessel transits through the underwater thermocline.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
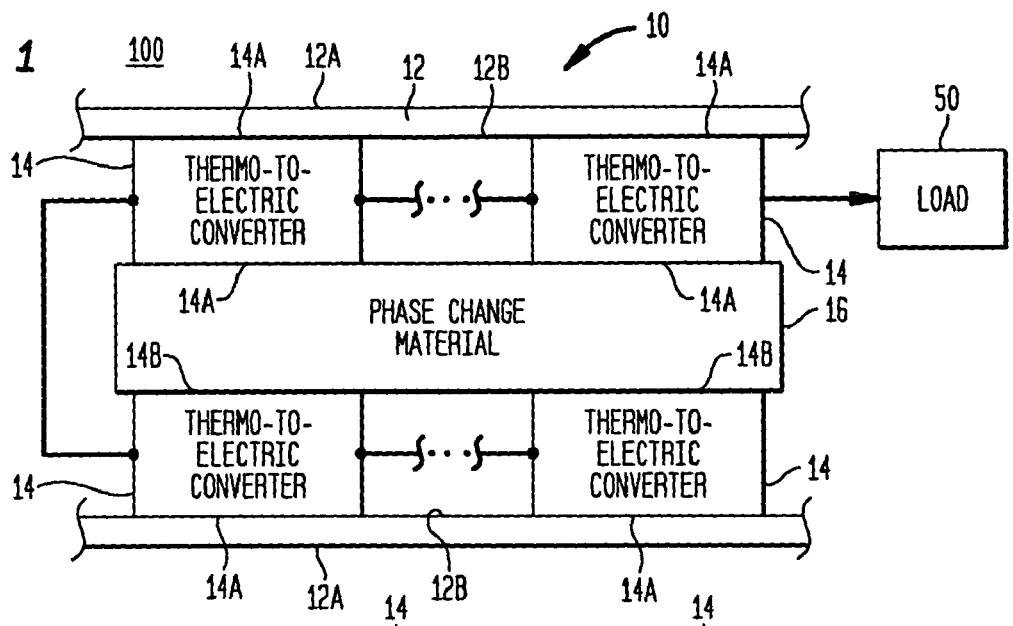
FIG. 1 is a schematic view of an underwater power generator that can use an underwater thermocline to generate electrical power in accordance with the present invention.

Referring now to the drawings, and more particularly to FIG. 1, an underwater power generator in accordance with the present invention is shown and is referenced generally by number 10. Typically, power generator 10 will be incorporated into a manned or unmanned navigating underwater vessel (not shown in FIG. 1) for the purpose of supplying electrical power for the vessel.

Power generator 10 is contained within a thermally-conductive shell 12 which can also form a portion of the underwater vessel in which power generator 10 is incorporated. Shell 12 is any thermally conductive material that efficiently conducts thermal energy, protects the elements of power generator 10 contained therein, and can withstand the rigors of underwater environments to include substantial operating depths on the order of 1000 meters or more. Suitable materials include aluminum and steel among others. The outer surface 12A of shell 12 will be exposed to an underwater environment 100 while the inner surface 12B of shell 12 remains dry.

Thermally coupled to inner surface 12A are a plurality of thermo-to-electric energy converters 14. Converters 14 can be realized by devices such as thermoelectric elements, thermionic devices, and thermosyphon rankine converters, just to name a few. Accordingly, it is to be understood that the choice of thermo-to-electric converter 14 is not a limitation of the present invention.

Each of converters 14 is capable of generating electric power when a thermal gradient exists thereacross. For example, each of converters 14 can be a thermoelectric element that generates electric power when a thermal gradient develops between opposing surfaces 14A and 14B. Each surface 14A is thermally coupled to inner surface 12B. As is known in the art, such thermal coupling can be achieved by soldering, the application of thermal grease between surfaces, etc. Converters 14 are electrically coupled to one another (e.g., via wires) in series, parallel or a combination thereof. Furthermore, converters 14 are electrically coupled to a load 50 which can be a power storage device, rechargeable batteries, or systems requiring electrical power.

Thermally coupled to each surface 14B of converters 14 is a phase change material 16 that will change phase (e.g., solid to liquid) at a known temperature. Briefly, phase change material 16 in underwater power generator 10 provides a large thermal mass at surfaces 14B. This thermal mass keeps the temperature of surfaces 14B at a constant or near constant temperature, which is the phase change temperature of the phase change material. Keeping the temperature at surfaces 14B constant generally allows for a larger overall temperature gradient across converters 14. A larger temperature difference provides at least two benefits. First, it allows for an overall greater flux of heat energy between the inside and outside of shell 12. Secondly, higher temperature differences across converters 14 generally provide for higher energy conversion efficiency.

As will be explained further below, the present invention will provide the means to supply electric power to underwater vessels that can transit through an underwater thermocline defined between the water's surface and depths up to 1000 meters or more. In such use, power generator 10 will develop power from the variation in water temperature with depth, which can vary between 4-35° C. depending on geographic location, time of year, and depth of operation. For converters 14 made from thermoelectric elements, suitable thermoelectric materials that efficiently produce electric power in this temperature range include bismuth telluride ($Bi_2Te_3$), and bismuth telluride-antimony telluride ($Bi_2Te_3$-$Sb_2Te_3$) in the form of a quantum well superlattice structure.

Phase change material 16 should possess a large heat of fusion thereby allowing the material to maintain a constant temperature even after absorbing a relatively large amount of heat. An inexpensive and readily available material satisfying this criterion is a paraffin wax. Further, the general molecular structure of a paraffin wax (i.e., having the molecular structure governed by $C_nH_{2n+2}$) allows the phase change temperature thereof to be tailored (i.e., by changing "n") for a specific or expected operating range of temperatures. For reasons that will become clearer below, it is preferred that the phase change temperature of the phase change material be equal to approximately the midpoint or average of the expected temperature range of operation. For example, if the expected operating temperature range is 4-30° C., the phase change temperature of phase change material 16 should preferably be approximately 17° C.

Figure 2:
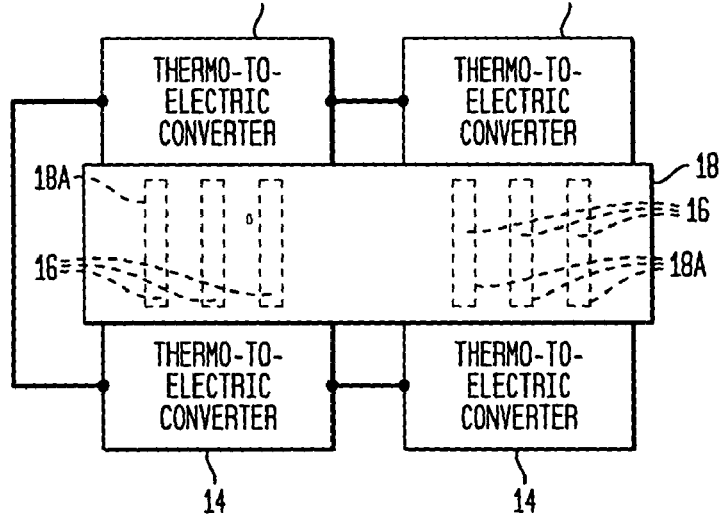
FIG. 2 is a schematic view of the underwater power generator's phase change material contained within tubes of a material structure.

Since the buoyancy of an underwater vessel must be maintained and/or managed during the diving or raising thereof, it may be necessary to contain phase change material 16 within a structure that allows the overall thermal mass (defined by this structure and phase change material 16) to maintain a constant density. One way of achieving this is illustrated in FIG. 2 where a material structure 18 has tubular passages 18A formed therein that are filled with phase change material 16. Passages 18A can be macroscopic or microscopic in size without departing from the scope of the present invention. Structure 18 is positioned adjacent thermoelectric elements 14 so that phase change material 16 remains in thermal contact therewith. The particular choice of material structure 18 is not a limitation of the present invention. For example, material structure 18 could be as simple as cardboard or could be specifically designed/shaped to fit a particular application.

Figure 3:
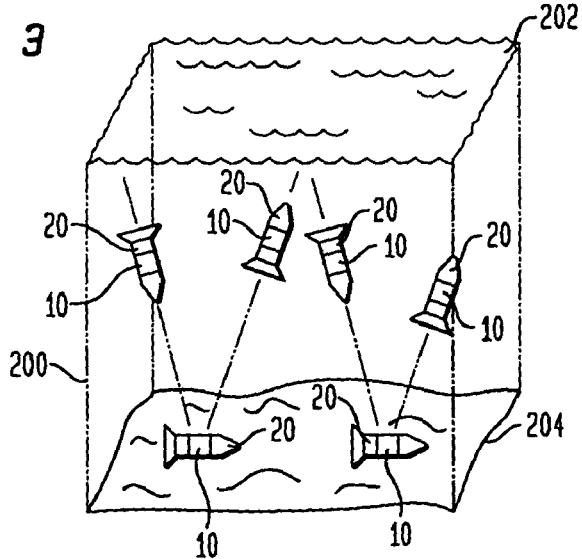
FIG. 3 illustrates an underwater vessel transiting an underwater thermocline in order to generate electric power for the vessel in accordance with the present invention.

Referring additionally now to FIG. 3, an operational scenario of the present invention is illustrated where an underwater vessel/vehicle 20 is shown repeatedly transiting up and down through a body of water 200. Vessel/vehicle 20 is equipped with underwater power generator 10 as described above. Each time vehicle/vessel 20 transits from surface 202 to bottom 204 of body of water 200 (and vice versa), it transits the water's thermocline. During such transiting of the thermocline, phase change material 16 remains at a fairly constant temperature which is an average of the temperature extremes encountered during the transit process. As a result, a temperature gradient is produced across each of converters 14 which, in turn, converts part of the heat energy being transferred into electrical energy for use by load 50. For the case where the phase change temperature of material 16 is equal to approximately the average of the expected temperature range in the thermocline to be transited, energy will be generated throughout the thermocline except for any relatively small periods of time that the temperature of the water is equal to the phase change temperature of material 16.

The advantages of the present invention are numerous. Electrical power is generated as an underwater vessel transits an underwater thermocline. Such power generation can be produced indefinitely simply by repeatedly transiting an underwater thermocline. Alternatively, power can be supplied on an "as needed" basis by monitoring vehicle power stores and then transiting the underwater thermocline when such power stores are low. The present invention presents a virtually maintenance-free approach to underwater power generation as no moving parts are required.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. An underwater power generator comprising:
    an underwater vessel for navigating through a body of water in order to transit through an underwater thermocline having a temperature range, said underwater vessel including a shell;
    at least a portion of said shell of said underwater vessel made from a thermally conductive material, said portion having an outer surface in contact with the body of water and an inner surface opposing said outer surface and not in contact with the body of water;
    a plurality of thermo-to-electric energy converters electrically coupled together, each of said plurality of thermo-to-electric energy converters having a first surface and a second surface with said first surface being thermally coupled to said inner surface of said portion of said shell; and
    a phase change material thermally coupled to each said second surface of said plurality of thermo-to-electric energy converters, said phase change material having a phase change temperature that is approximately equal to an average of upper and lower temperature extremes of said temperature range of said underwater thermocline, wherein said plurality of thermo-to-electric energy converters generate electrical power as said underwater vessel navigates through the body of water so that said underwater vessel transits through said underwater thermocline.

2. An underwater power generator as in claim 1 wherein each of said plurality of thermo-to-electric energy converters is selected from the group consisting of bismuth telluride and bismuth telluride-antimony telluride.

3. An underwater power generator as in claim 1 wherein said phase change material is a paraffin wax.

4. An underwater power generator as in claim 3 wherein each of said plurality of thermo-to-electric energy converters is selected from the group consisting of bismuth telluride and bismuth telluride-antimony telluride.

5. An underwater power generator as in claim 1 further comprising a material structure having tubular passages formed therein and filled with said phase change material, said material structure positioned adjacent said plurality of thermo-to-electric energy converters.

6. An underwater power generator as in claim 5 wherein said phase change material is a paraffin wax.

7. An underwater power generator as in claim 6 wherein each of said plurality of thermo-to-electric energy converters is selected from the group consisting of bismuth telluride and bismuth telluride-antimony telluride.

8. An underwater power generator as in claim 1 wherein said plurality of thermo-to-electric energy converters are electrically coupled together in series.

9. An underwater power generator as in claim 1 wherein said plurality of thermo-to-electric energy converters are electrically coupled together in parallel.

10. A method of generating power underwater comprising the steps of:
providing a navigating underwater vessel in a body of water having an underwater thermocline, the underwater vessel having at least a portion of a shell thereof made from a thermally conductive material, said portion having an outer surface in contact with the body of water and an inner surface opposing said outer surface and not in contact with the body of water;
providing a plurality of thermo-to-electric energy converters electrically coupled together, each of said plurality of thermo-to-electric energy converters having a first surface and a second surface;
positioning said plurality of thermo-to-electric energy converters such that each said first surface is thermally coupled to said inner surface of said portion of said shell;
thermally coupling a phase change material to each said second surface of said plurality of thermo-to-electric energy converters, said phase change material having a phase change temperature that is approximately equal to an average of upper and lower temperature extremes of a temperature range of said underwater thermocline; and
navigating the underwater vessel through the body of water in order to transit said underwater thermocline, wherein said plurality of thermo-to-electric energy converters generate electrical power.

11. A method according to claim 10 further comprising the step of continuously repeating said step of navigating.

12. A method according to claim 10 wherein each of said plurality of thermo-to-electric energy converters is selected from the group consisting of bismuth telluride and bismuth telluride-antimony telluride.

13. A method according to claim 10 wherein said phase change material is a paraffin wax.

14. A method according to claim 10 further comprising the steps of:
providing a material structure having tubular passages formed therein and filled with said phase change material; and
positioning said material structure adjacent said plurality of thermo-to-electric energy converters.

15. A method according to claim 14 wherein said phase change material is a paraffin wax.

16. A method according to claim 15 wherein each of said plurality of thermo-to-electric energy converters is selected from the group consisting of bismuth telluride and bismuth telluride-antimony telluride.

* * * * *